United States Patent
Jones et al.

(10) Patent No.: US 7,451,412 B2
(45) Date of Patent: Nov. 11, 2008

(54) SPEEDING UP TIMING ANALYSIS BY REUSING DELAYS COMPUTED FOR ISOMORPHIC SUBCIRCUITS

(75) Inventors: Larry G. Jones, San Jose, CA (US); Feng Li, San Jose, CA (US); Mohan Rangan Govindaraj, Menlo Park, CA (US); Bradley R. Roetcisoender, Kirkland, WA (US); Michael G. Weaver, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 364 days.

(21) Appl. No.: 11/198,451

(22) Filed: Aug. 4, 2005

(65) Prior Publication Data

US 2007/0033561 A1 Feb. 8, 2007

(51) Int. Cl.
*G06F 17/50* (2006.01)
(52) U.S. Cl. .................. 716/4; 716/5; 716/6; 703/14
(58) Field of Classification Search .............. 716/4–6; 703/14
See application file for complete search history.

(56) References Cited

U.S. PATENT DOCUMENTS

| | | | | |
|---|---|---|---|---|
| 5,831,869 A * | 11/1998 | Ellis et al. | ................ | 716/6 |
| 5,966,521 A * | 10/1999 | Takeuchi et al. | ........... | 716/6 |
| 6,009,252 A * | 12/1999 | Lipton | .................. | 716/5 |
| 6,202,192 B1 * | 3/2001 | Donath et al. | ............ | 716/6 |
| 6,286,128 B1 * | 9/2001 | Pileggi et al. | ............ | 716/18 |
| 6,334,205 B1 * | 12/2001 | Iyer et al. | ............ | 716/7 |
| 6,473,881 B1 * | 10/2002 | Lehner et al. | ............ | 716/2 |
| 6,499,129 B1 * | 12/2002 | Srinivasan et al. | ....... | 716/4 |
| 6,557,145 B2 * | 4/2003 | Boyle et al. | ............ | 716/2 |
| 6,591,402 B1 * | 7/2003 | Chandra et al. | ........ | 716/5 |
| 6,782,511 B1 * | 8/2004 | Frank et al. | ............ | 716/1 |
| 7,143,021 B1 * | 11/2006 | McGaughy et al. | ....... | 703/14 |
| 7,257,525 B2 * | 8/2007 | McGaughy | ............ | 703/14 |

\* cited by examiner

Primary Examiner—Jack Chiang
Assistant Examiner—Naum B Levin
(74) Attorney, Agent, or Firm—Park, Vaughan & Fleming LLP

(57) ABSTRACT

One embodiment of the present invention provides a system that speeds up timing analysis by reusing delays computed for isomorphic subcircuit. During operation, the system receives a circuit block to be analyzed, wherein the circuit block is in the form of a netlist. The system then subdivides the circuit block into a set of subcircuits. The subcircuits are then partitioned into equivalence classes, which contain subcircuits which are topologically isomorphic to each other. Next, the system performs a timing analysis by tracing paths through a timing graph for the circuit block. During this timing analysis, whenever a delay is required for a subcircuit, the system determines if a corresponding delay has been already computed for the equivalence class associated with the subcircuit. If so, the system reuses the delay. If not, the system computes the delay for the subcircuit, and then associates the computed delay with the equivalence class so that the computed delay can be reused for isomorphic subcircuits.

20 Claims, 4 Drawing Sheets

SPEEDING UP TIMING ANALYSIS BY REUSING DELAYS COMPUTED FOR ISOMORPHIC SUBCIRCUITS

BACKGROUND

1. Field of the Invention

The present invention relates to techniques for analyzing timing in circuits. More specifically, the present invention relates to a method and an apparatus for speeding up timing analysis by reusing delays computed for isomorphic subcircuits.

2. Related Art

Circuit design is presently accomplished primarily through the use of computer aided design (CAD) tools, which take as input a circuit specification and automatically generates a circuit description suitable for implementation. This circuit description can subsequently be analyzed using a number of different techniques to estimate the performance of the circuit before the circuit is fabricated. This allows the design of the circuit to be modified to correct performance problems before the circuit is actually fabricated, which can greatly reduce the time and expense involved in the circuit development process.

Unfortunately, these circuit analysis techniques are often too expensive to be applied to a large number of circuit elements at once. To reduce this complexity, a circuit is typically subdivided into smaller subcircuits, and the analysis technique is applied to each subcircuit. Next, results from analysis of subcircuits are combined to create a solution for the entire circuit. For example, in the transistor-level static timing analysis problem, circuits are often subdivided into channel-connected subcircuits, which are individually analyzed for timing. The analyzed delays for these subcircuits are combined to determine the timing for the larger circuit.

While this subdivision technique reduces the overall complexity considerably, the analysis of the individual subcircuits, which often involves time-consuming circuit-simulation operations, can dominate the total time required to validate the timing of the entire circuit. For example, in the standard-cell design methodology, the process of characterizing a library of cells for timing often takes orders of magnitude longer than gate-level static timing analysis of a large block constructed of the library of cells. In another example, in the custom design methodology, the transistor-level static timing tool typically spends over 85% of its time deriving delays for the subcircuits comprising the custom block.

Hence, what is needed is a method and an apparatus for analyzing the performance of a circuit without the above-described performance problems associated with analyzing the individual subcircuits.

SUMMARY

One embodiment of the present invention provides a system that speeds up timing analysis by reusing delays computed for isomorphic subcircuits. During operation, the system receives a circuit block to be analyzed, wherein the circuit block is in the form of a netlist. The system then subdivides the circuit block into a set of subcircuits. The subcircuits are then partitioned into equivalence classes, which contain subcircuits which are topologically isomorphic to each other. Next, the system performs a timing analysis by tracing paths through a timing graph for the circuit block. During this timing analysis, whenever a delay is required for a subcircuit, the system determines if corresponding delay information has been already computed for the equivalence class associated with the subcircuit. If so, the system reuses this information to derive the specific delay information required for the subcircuit. If not, the system computes the required delay information for the subcircuit, and then associates the computed delay information with the equivalence class so that the computed delay information can be reused for isomorphic subcircuits.

In a variation on this embodiment, prior to partitioning the set of subcircuits into equivalence classes, the system reads in equivalence classes and corresponding results which were previously generated during a prior timing analysis. This allows the previously-generated equivalence classes and corresponding results to be reused while performing the present timing analysis for the circuit block.

In a variation on this embodiment, after the timing analysis has been performed on the circuit block, the system writes out data generated during the timing analysis along with corresponding equivalence class information to a file to be reused during a subsequent timing analysis.

In a variation on this embodiment, partitioning the set of subcircuits into equivalence classes involves considering either: the topology of the subcircuits alone; or the topology of the subcircuits and a set of circuit parameters, such as transistor width, device model, process, temperature, and parasitic devices such as resistors and capacitors.

In a further variation, the system changes the set of circuit parameters used in partitioning the set of subcircuits into equivalence classes to either increase or decrease the resulting number of equivalence classes.

In a variation on this embodiment, partitioning the set of subcircuits into equivalence classes additionally involves: creating a mapping from each subcircuit to its corresponding equivalence class; and creating a mapping from each equivalence class to each subcircuit in the equivalence class.

In a variation on this embodiment, the timing information produced for a subcircuit during the timing analysis includes minimum and/or maximum signal arrival times at outputs of the subcircuit in response to a specific rising or falling signal waveform on a specific input of the subcircuit in the presence of a specific load.

DETAILED DESCRIPTION

Subcircuits

The design of custom high-speed circuits is often a manually intensive effort that requires detailed simultaneous attention to a large number of constraints including device count, device widths, ratio of widths, input ordering, edge-rate optimization, floor-planning, wire-planning, wire-spacing, diode placement, well and substrate contact placement, etc. In an effort to reduce the overall complexity of the design problem, custom designers often approach the problem using a "structured-custom" design-style that exploits the repetitive nature of the problem, breaking a large circuit into identical, or nearly-identical subcircuits. Thus, data-path, register-files, and memories, are typically built by repeating patterns of identical or nearly identical subcircuits built from identical or nearly identical layout "tiles." Because the layout is also similar, resistor and capacitor parasitics that may have a large impact on the analysis of the subcircuits may also be nearly identical. This invention exploits this natural tendency to create identical or nearly identical subcircuits within large circuits.

The repeated occurrence of subcircuits within a large circuit block often transcends a single block. As subcircuits and layouts used in one block are often reused in other blocks of the same integrated circuit, even though these blocks often may be designed by different design teams and analyzed separately by the circuit analysis tool. Many of the underlying technology design criterion are identical between these blocks and this invention exploits the fact that subcircuits in different blocks on the same integrated circuit not only may be identical topologically, but also with respect to technology parameters.

While detailed analysis of a subcircuit may require specifics of the integrated circuit such as technology, voltage, temperatures, etc., many of the steps required in the circuit analysis technique may be independent of the integrated circuit technology specifics while being dependent on the topology of the subcircuits. Thus, while the technology design criterion between two totally independent integrated circuits may differ considerably, much of the work required to analyze topologically identical subcircuits in the two integrated circuits is the same and this invention also exploits the use of common building blocks that are used in a multiple of independently designed and manufactured integrated circuits by different design teams and even by different design companies.

Figure 1:
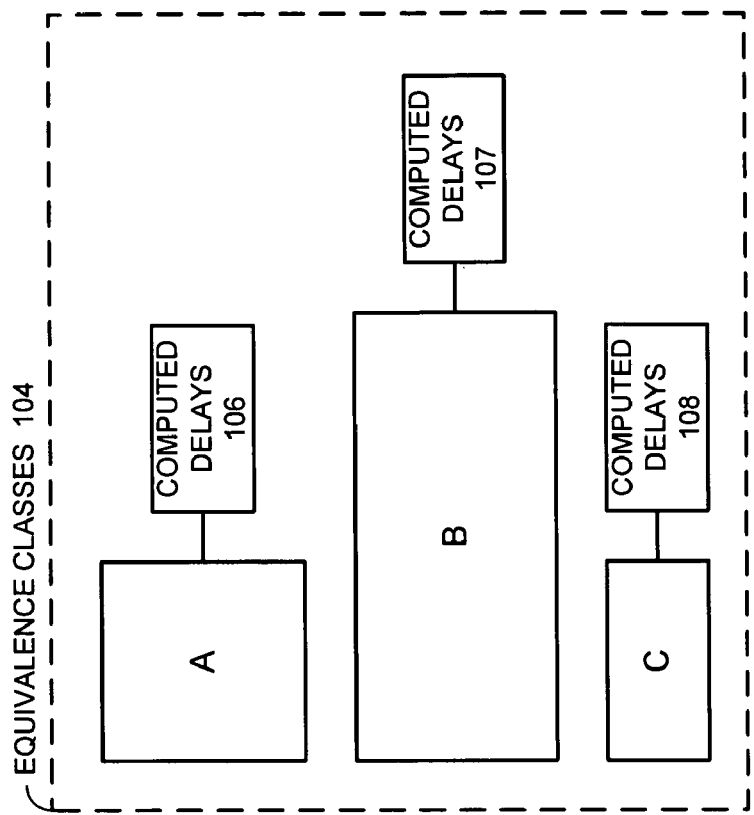
FIG. 1 illustrates subcircuits in a circuit block and associated equivalence classes in accordance with an embodiment of the present invention.
Figure 1:
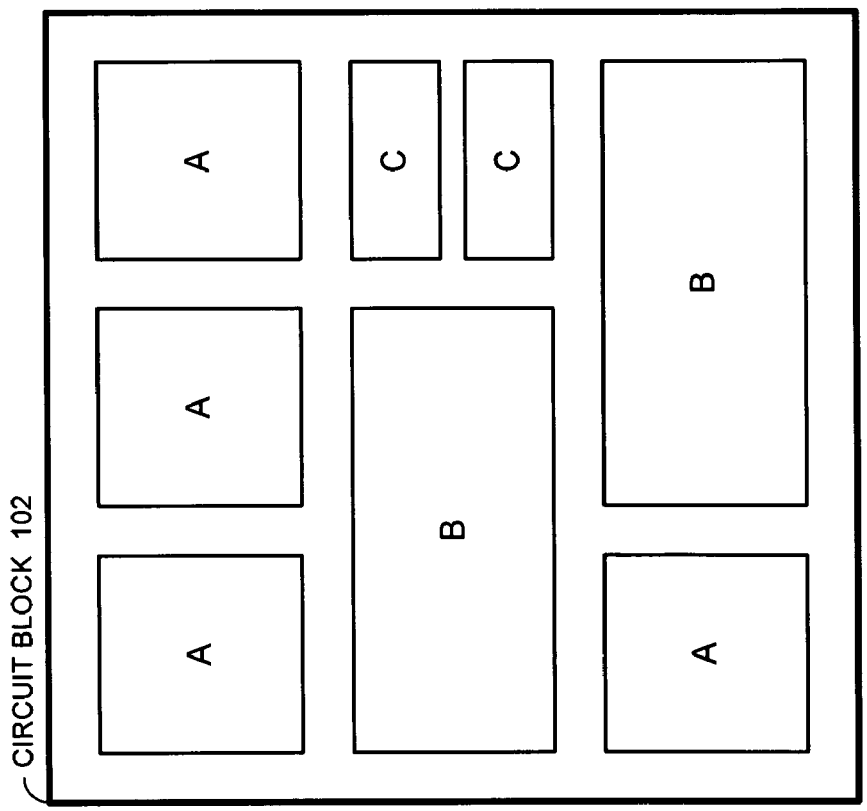

For example, FIG. 1 illustrates subcircuits within a circuit block and associated equivalence classes in accordance with an embodiment of the present invention.

FIG. 1 illustrates a circuit block 102, which is comprised of a number of subcircuits. FIG. 1 also illustrates three equivalence classes 104, labeled A, B and C. Note that subcircuits with substantially identical structure in circuit block 102 are associated with the same equivalence class. In particular, circuit block 102 contains four subcircuits that belong to equivalence class A, two subcircuits that belong to equivalence class B and two subcircuits that belong to equivalence class C. One embodiment of the present invention also stores computed delays 106, 107 and 108 for equivalence classes, A, B and C, respectively.

Timing Analysis Process

Figure 3:
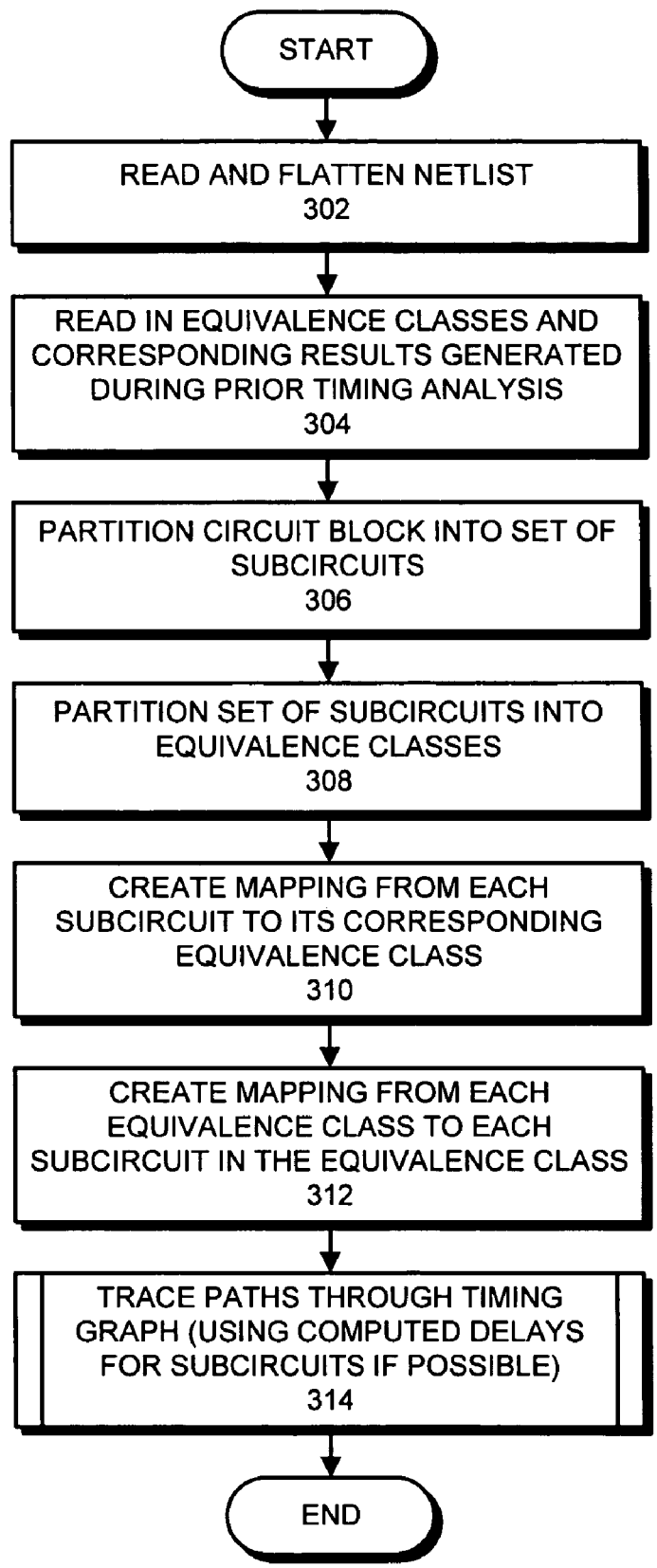
FIG. 3 presents a flow chart illustrating how the timing of a circuit is analyzed in accordance with an embodiment of the present invention.

FIG. 3 presents a flow chart illustrating how the timing of a circuit is analyzed in accordance with an embodiment of the present invention. The system starts by reading in a hierarchical representation for a netlist for a circuit block and then "flattening" the hierarchical representation to produce a flattened netlist for the circuit block (step 302).

Next, the system reads in equivalence classes and corresponding results generated during a prior timing analysis (step 304). These results can include analysis results associated with an equivalence class along with a unique and repeatable identifier of the equivalence class so that the results may be reused in a subsequent analysis of the same block, a different block, a different integrated circuit, or by a different analysis tool used on the same block, a different block, or a different integrated circuit. Note that the system can alternatively start without any pre-existing equivalence classes.

The system then subdivides the circuit block into a set of subcircuits (step 306).

Next, the system automatically partitions the circuit block into equivalence classes of subcircuits that are topologically equivalent (isomorphic), which may involve reusing some or all of the pre-existing equivalence. When establishing new equivalence classes, the system possibly considers a subset of relevant technology and circuit context parameters (step 308). In practice, this partitioning can be accomplished quickly using hashing and graph isomorphism techniques. Note that the parameter subset may be void of any parameters so that only the topology of the circuit (connectivity of devices) is considered.

Alternatively, the parameter subset may contain a wide variety of parameters such as transistor width, device model, resistor and capacitor parasitics, process, temperature, etc. Varying the parameter subset may result in an increase or decrease in the number of partitions created. More partitions may reduce the amount of analysis reused, but increase other qualities, such as accuracy of the analysis. Some analysis methods may require many partitions, while other analysis methods may yield acceptable results with few but very large partitions. Note that the system can use more or different parameters to create different partitions and equivalence classes in order to further improve the amount of analysis reuse.

The system then creates a mapping from each subcircuit to a corresponding equivalence class (step 310), and also creates a mapping from each equivalence class to each subcircuit that belongs to the equivalence class (step 312). These mappings allow the system to associate an equivalence class with results from any analysis of a subcircuit that is a member of the equivalence class. This allows the system to reuse results for members of the same equivalence class.

Figure 2:
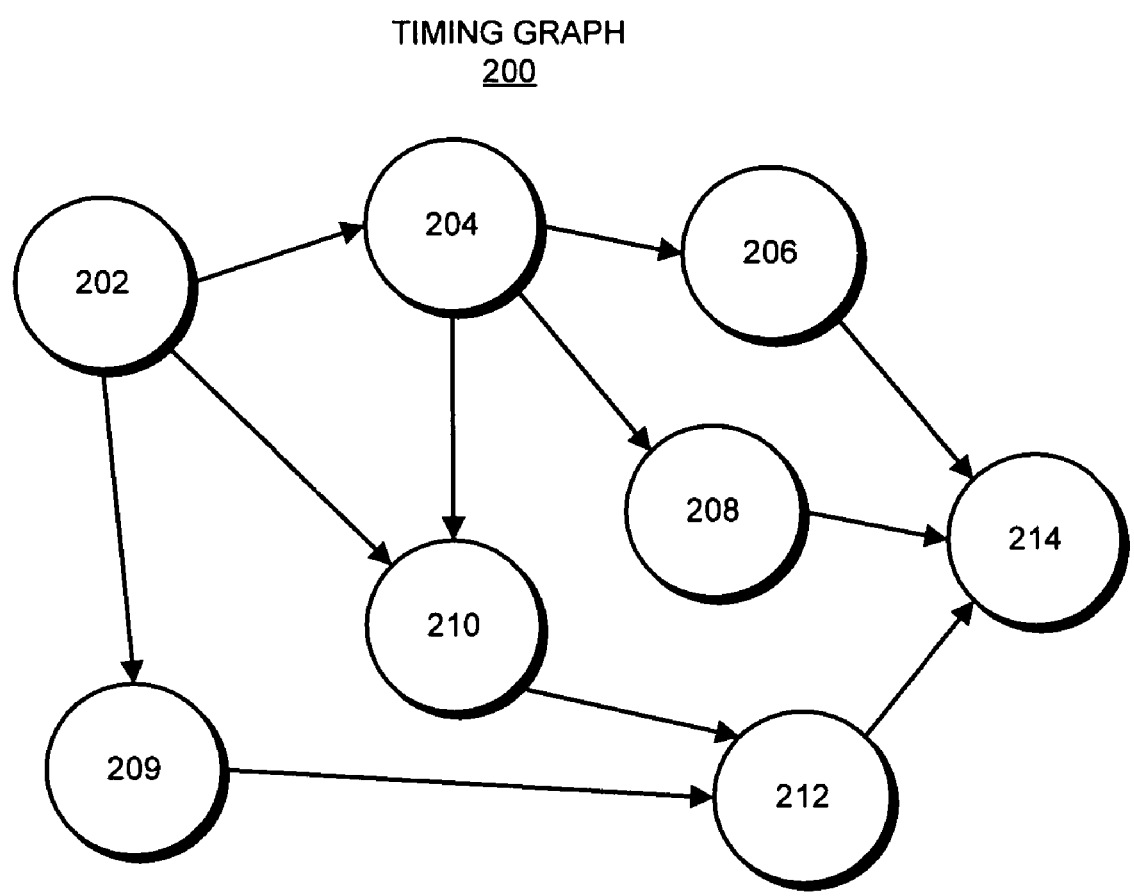
FIG. 2 illustrates a timing graph in accordance with an embodiment of the present invention.

Next, the system determines delays through the circuit block by tracing paths through a timing graph for the circuit block to derive critical timing information such as clock and data arrival time information (step 314). Note that a timing graph is an abstraction of a netlist, which can be represent as a directed graph, with vertices representing specific electrical nodes in the circuit and directed edges (arcs) representing delays between these electrical nodes (see FIG. 2).

Figure 4:
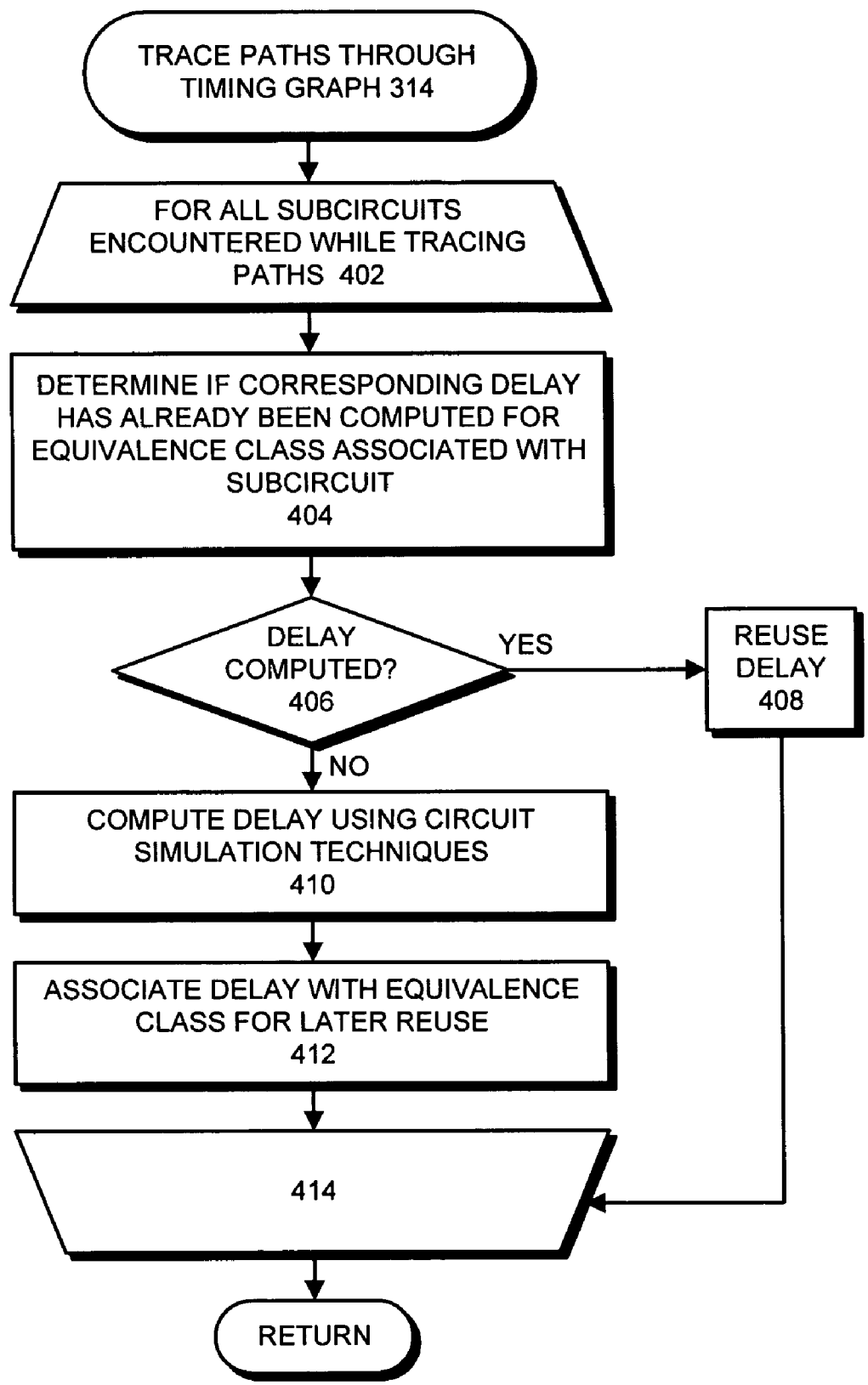
FIG. 4 presents a flow chart illustrating how a delay for a subcircuit is computed in accordance with an embodiment of the present invention.

During this process, whenever a delay is required for a subcircuit, the system performs a number of operations which are illustrated in FIG. 4 below. The system first determines if a corresponding delay has been computed for each equivalence class associated with the subcircuit (step 404). If this delay has been computed, the system reuses the delay (step 408). (Note that if such delays have been precomputed for similar subcircuits, but not this exact subcircuit, the delay computation may involve interpolating from the precomputed delays for the similar subcircuits.)

Otherwise, if no delay value has been precomputed, the system computes the delay using circuit simulation techniques (or alternatively, through other delay-computation techniques, such as techniques that involve closed form solutions for RC models or interpolation) (step 410). Finally, after the delay has been computed, the system associates the delay with the corresponding equivalence class so that the delay can be reused (step 412).

After this timing analysis is complete, the system can report the results. The system can also store the results associated with an equivalence class along with a unique and repeatable identifier of the equivalence class to an external media. This allows the results to be reused at a later time for an analysis of the same block, or at any time with a different block, a different integrated circuit, or by a different analysis tool used on the same block, a different block, or a different integrated circuit.

Note that the above-described "timing analysis" may involve generating a list of operations, and the list of operations can be then be applied to any or all subcircuits of the equivalence class during subsequent timing analysis operations. The timing analysis may also involve generating timing data that can then be used in subsequent analyses of subcircuits belonging to the same equivalence class.

The present invention can dramatically increase the speed of static timing analysis of transistor-level custom circuits, and can also reduce the memory required for analysis while maintaining accuracy. However, the technique can also be applied to other methods of circuit analysis or to other styles of circuit design.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art.

Additionally, the above disclosure is not intended to limit the present invention. The scope of the present invention is defined by the appended claims.

What is claimed is:

1. A method for speeding up timing analysis by reusing delays computed for isomorphic subcircuits, comprising:
   receiving a circuit block to be analyzed, wherein the circuit block is in the form of a netlist;
   subdividing the circuit block into a set of subcircuits;
   partitioning the set of subcircuits into equivalence classes, wherein each equivalence class contains subcircuits which are topologically isomorphic to each other as determined using graph isomorphism techniques; and
   performing a timing analysis for the circuit block by tracing paths through a timing graph for the circuit block, wherein the timing graph is an abstraction of a netlist with vertices representing specific electrical nodes in the circuit block and directed edges representing delays between the specific electrical nodes;
   wherein whenever a delay is required for a sub circuit during the timing analysis, the method further comprises,
      determining if a corresponding delay has been already computed for the equivalence class associated with the subcircuit,
      if so, reusing the delay, and
      if not, computing the delay for the subcircuit, and associating the computed delay with the equivalence class so that the computed delay can be reused for isomorphic subcircuits.

2. The method of claim 1, wherein prior to partitioning the set of subcircuits into equivalence classes, the method further comprises reading in equivalence classes and corresponding results which were previously generated during a prior timing analysis so the previously-generated equivalence classes and corresponding results can be reused while performing the present timing analysis for the circuit block.

3. The method of claim 1, wherein after the timing analysis has been performed on the circuit block, the method further comprises writing out data generated during the timing analysis along with corresponding equivalence class information to a file to be reused during a subsequent timing analysis.

4. The method of claim 1, wherein partitioning the set of subcircuits into equivalence classes involves considering either:
   the topology of the subcircuits alone; or
   the topology of the subcircuits and a set of circuit parameters, such as transistor width, device model, resistor and capacitor parasitics, process and temperature.

5. The method of claim 4, further comprising changing the set of circuit parameters used in partitioning the set of subcircuits into equivalence classes to either increase or decrease the resulting number of equivalence classes.

6. The method of claim 1, wherein partitioning the set of subcircuits into equivalence classes additionally involves:
   creating a mapping from each subcircuit to its corresponding equivalence class; and
   creating a mapping from each equivalence class to each subcircuit in the equivalence class.

7. The method of claim 1, wherein the timing information produced for a subcircuit during the timing analysis includes minimum and/or maximum signal arrival times at outputs of the subcircuit in response to a specific rising or falling waveform on a specific input of the subcircuit.

8. A computer-readable storage device storing instructions that when executed by a computer cause the computer to perform a method for speeding up timing analysis by reusing delays computed for isomorphic subcircuits, the method comprising:
   receiving a circuit block to be analyzed, wherein the circuit block is in the form of a netlist;
   subdividing the circuit block into a set of subcircuits;
   partitioning the set of subcircuits into equivalence classes, wherein each equivalence class contains subcircuits which are topologically isomorphic to each other as determined using graph isomorphism techniques; and
   performing a timing analysis for the circuit block by tracing paths through a timing graph for the circuit block, wherein the timing graph is an abstraction of a netlist with vertices representing specific electrical nodes in the circuit block and directed edges representing delays between the specific electrical nodes;
   wherein whenever a delay is required for a sub circuit during the timing analysis, the method further comprises,
      determining if a corresponding delay has been already computed for the equivalence class associated with the subcircuit,
      if so, reusing the delay, and
      if not, computing the delay for the subcircuit, and associating the computed delay with the equivalence class so that the computed delay can be reused for isomorphic subcircuits.

9. The computer-readable storage device of claim 8, wherein prior to partitioning the set of subcircuits into equivalence classes, the method further comprises reading in equivalence classes and corresponding results which were previously generated during a prior timing analysis so the previously-generated equivalence classes and corresponding results can be reused while performing the present timing analysis for the circuit block.

10. The computer-readable storage device of claim 8 wherein after the timing analysis has been performed on the circuit block, the method further comprises writing out data generated during the timing analysis along with corresponding equivalence class information to a file to be reused during a subsequent timing analysis.

11. The computer-readable storage device of claim 8, wherein partitioning the set of subcircuits into equivalence classes involves considering either:
   the topology of the subcircuits alone; or
   the topology of the subcircuits and a set of circuit parameters, such as transistor width, device model, parasitics, process and temperature.

12. The computer-readable storage device of claim 11, wherein the method farther comprises changing the set of circuit parameters used in partitioning the set of subcircuits into equivalence classes to either increase or decrease the resulting number of equivalence classes.

13. The computer-readable storage device of claim 8, wherein partitioning the set of subcircuits into equivalence classes additionally involves:
   creating a mapping from each subcircuit to its corresponding equivalence class; and
   creating a mapping from each equivalence class to each subcircuit in the equivalence class.

14. The computer-readable storage device of claim 8, wherein the timing information produced for a subcircuit during the timing analysis includes minimum and/or maximum signal arrival times at outputs of the subcircuit in response to a specific slope on a specific input of the subcircuit.

15. An apparatus that speeds up timing analysis by reusing delays computed for isomorphic subcircuits, comprising:
   a receiving mechanism configured to receive a circuit block to be analyzed, wherein the circuit block is in the form of a netlist;
   a circuit subdivision mechanism configured to subdivide the circuit block into a set of subcircuits;
   an equivalence-class-generation mechanism configured to partition the set of subcircuits into equivalence classes, wherein each equivalence class contains subcircuits which are topologically isomorphic to each other as determined using graph isomorphism techniques;
   a timing analyzer configured to perform a timing analysis for the circuit block by tracing paths through a timing graph for the circuit block, wherein the timing graph is an abstraction of a netlist with vertices representing specific electrical nodes in the circuit block and directed edges representing delays between the specific electrical nodes;
   wherein whenever a delay is required for a sub circuit during the timing analysis, the timing analyzer is configured to,
      determine if a corresponding delay has been already computed for the equivalence class associated with the subcircuit,
      if so, to reuse the delay, and
      if not, to compute the delay for the subcircuit, and to associate the computed delay with the equivalence class so that the computed delay can be reused for isomorphic subcircuits.

16. The apparatus of claim 15, wherein prior to partitioning the set of subcircuits into equivalence classes, the receiving mechanism is configured to read in equivalence classes and corresponding results which were previously generated during a prior timing analysis so the previously-generated equivalence classes and corresponding results can be reused while performing the present timing analysis for the circuit block.

17. The apparatus of claim 15, further comprising an output mechanism, wherein after the timing analysis has been performed on the circuit block, the output mechanism is configured to write out data generated during the timing analysis along with corresponding equivalence class information to a file to be reused during a subsequent timing analysis.

18. The apparatus of claim 15, wherein while partitioning the set of subcircuits into equivalence classes, the equivalence-class-generation mechanism is configured to consider either:
   the topology of the subcircuits alone; or
   the topology of the subcircuits and a set of circuit parameters, such as transistor width, device model, parasitics, process and temperature.

19. The apparatus of claim 18, wherein the equivalence-class-generation mechanism is configured to change the set of circuit parameters used in partitioning the set of subcircuits into equivalence classes to either increase or decrease the resulting number of equivalence classes.

20. The apparatus of claim 15, wherein while partitioning the set of subcircuits into equivalence classes, the equivalence-class-generation mechanism is additionally configured to:
   create a mapping from each subcircuit to its corresponding equivalence class; and to
   create a mapping from each equivalence class to each subcircuit in the equivalence class.

* * * * *

UNITED STATES PATENT AND TRADEMARK OFFICE
CERTIFICATE OF CORRECTION

PATENT NO.       : 7,451,412 B2                                          Page 1 of 1
APPLICATION NO.  : 11/198451
DATED            : November 11, 2008
INVENTOR(S)      : Larry G. Jones et al.

It is certified that error appears in the above-identified patent and that said Letters Patent is hereby corrected as shown below:

In claim 12 (at column 7, line 18), please delete the word "farther" and replace it with the word --further--.

Signed and Sealed this

Seventeenth Day of February, 2009

JOHN DOLL
*Acting Director of the United States Patent and Trademark Office*